United States Patent [19]
Badyal et al.

[11] Patent Number: 5,469,076
[45] Date of Patent: Nov. 21, 1995

[54] STATIC CURRENT TESTING APPARATUS AND METHOD FOR CURRENT STEERING LOGIC (CSL)

[75] Inventors: Rajeev Badyal, Fort Collins, Colo.; Scott Linn, Corvallis, Oreg.

[73] Assignee: Hewlett-Packard Corporation, Palo Alto, Calif.

[21] Appl. No.: 140,348

[22] Filed: Oct. 20, 1993

[51] Int. Cl.⁶ .......................... H03K 19/00; H03K 19/094
[52] U.S. Cl. .......................... 326/16; 326/115; 327/543; 324/527
[58] Field of Search .......................... 307/455, 296.1, 307/296.6, 296.8; 324/522, 527; 371/22.1, 22.6; 326/16, 115; 327/541, 543

[56] References Cited

U.S. PATENT DOCUMENTS

| | | | |
|---|---|---|---|
| 5,149,992 | 9/1992 | Allstot et al. | 307/443 |
| 5,159,212 | 10/1992 | Beaufils et al. | 307/296.4 |
| 5,189,316 | 2/1993 | Murakami et al. | 307/296.1 |
| 5,245,230 | 9/1993 | Ohri et al. | 307/296.4 |
| 5,250,854 | 10/1993 | Lien | 307/296.1 |
| 5,254,882 | 10/1993 | Eyck | 307/296.8 |
| 5,309,399 | 5/1994 | Murotani | 307/296.8 |

*Primary Examiner*—Edward P. Westin
*Assistant Examiner*—Richard Roseen

[57] ABSTRACT

A static current testing method for single-ended or differential logic circuits having a static bias current in normal operation. The static current testing method includes switching a first bias node between a first bias voltage, in a normal operational mode, and a first shut-off voltage, in a first static current testing phase, and measuring the current supplied to the logic circuit in the testing phase. For differential circuits, the static current testing method further includes an additional step of switching a second bias node between the second bias voltage in the normal operational mode and the second shut-off voltage in a second static current testing phase. A bias switching means is used to switch between the normal bias voltage and the testing voltage. A cell switching means is coupled to a diode-connected transistor for forcing the circuit output low and for isolating the diode-connected transistor from the output.

23 Claims, 4 Drawing Sheets

STATIC CURRENT TESTING APPARATUS AND METHOD FOR CURRENT STEERING LOGIC (CSL)

BACKGROUND OF THE INVENTION

This invention relates generally to semiconductor logic circuits and more particularly to the static current parametric testing of current steering logic circuits.

Static current testing of CMOS logic circuits has long been accepted as an effective parametric test for determining reliability problems in integrated circuits. This testing method begins by setting the circuit to a known static state and measuring the static current drawn by the device in this static state. If the measured leakage current exceeds a predetermined threshold level, the device is sorted out due to potential reliability problems. In a typical CMOS process, this threshold level is approximately 10–20 microamperes.

Due to the small value of the threshold level, static current testing requires that the device not consume any additional static current other than leakage currents. For typical CMOS circuits, this can be accomplished by simply disabling the clock signal during the test to eliminate any dynamic currents caused by the switching of the gates.

Where the device consumes a bias current under normal operating conditions, however, the device cannot be tested under these normal operating conditions because the bias current would need to be disabled. This effectively prevents whole families of circuits from being static current tested. For example, a logic circuit containing a constant current logic gate 30 shown in FIG. 3 or a folded source coupled logic gate 35 shown in FIG. 4 would be precluded from using static current testing due to the bias current consumed during normal operation. Constant current logic has several key advantages over typical CMOS, however, which make it more desirable in certain applications than typical CMOS.

Constant current logic minimizes one of the fundamental problems of typical CMOS logic circuits-electromagnetic interference (EMI). For example, referring to FIG. 1, a CMOS inverter 10 exhibits a current spike when the conduction regions of P-channel field effect transistor (FET) 14 and N-channel FET 12 overlap. The current spike occurs when input voltage $V_{IN}$, as seen at the gates of FET 12 and FET 14, is approximately equal to the threshold voltage $V_T$. The input voltage $V_{IN}$, and corresponding output voltage $V_{OUT}$, are shown in FIG. 2A. The corresponding current spike is shown in FIG. 2B.

As a consequence of this current spike, and others like it through out a logic circuit, two undesirable effects occur. The first is that the noise induced by the switching is coupled directly into the substrate and will couple into analog blocks on the same chip and thereby severely degrade the performance of the analog blocks. The second effect, and a potentially more detrimental one, is the electro-magnetic interference ("EMI") generated by the current spikes.

In many applications, a power supplying conductor, which supplies the logic gates with current, is routed across either a chip or a printed circuit board over a fairly large distance. The conductor (not shown) will have a finite inductance which is directly proportional to the length of the conductor. A current passing through an inductor produces a change in voltage dV according to the commonly know expression shown below:

$$dV = L \times (dI/dT),$$

where L represents the inductance of the inductor and dI represents the change in the current over the a corresponding change in time dT, as shown in FIG. 2B. The corresponding change in voltage dV is then radiated away from the power conductor with the power conductor acting as an antenna. This produces undesirable levels of EMI.

The constant current logic gate 30 shown in FIG. 3, for applications that do not require a low power circuit, can be used to virtually eliminate the current spike. The constant current logic gate 30 includes of a first P-channel current source transistor MP1 having a source connected to a supply terminal 22 for receiving a supply voltage $V_{DD}$, a gate 24 for receiving a predetermined bias voltage $V_{BIAS}$, and a drain. The P-channel transistor MP1 acts as a constant current source with the bias voltage biasing the transistor to conduct a predetermined amount of constant current. The constant current logic gate 30 also includes of a first N-channel transistor MN1 having a drain connected to the drain of the P-channel transistor MP1, a source coupled to a common terminal 20 for receiving a common voltage GND, and a gate 16 for receiving the input voltage $V_{IN}$.

In parallel with the N-channel transistor MN1 is a second diode-connected transistor MN2. The diode-connected transistor MN2 has a gate and a drain that are tied together that are connected to the drain of P-channel transistor MP1. Diode-connected transistor MN2 also has a source coupled to the common terminal 20. The gate-drain connection of transistor MN2 is connected to an output terminal 18 for providing the output voltage signal $V_{OUT}$.

The resulting constant current logic gate 30 is so called because it constantly conducts static current, regardless of the state of $V_{IN}$. This is seen by considering the possible voltage levels on the input voltage $V_{IN}$. Under normal operating conditions, the bias voltage $V_{BIAS}$ is set to a predetermined voltage level to bias the P-channel transistor MP1 in order to conduct a predetermined amount of constant current. The input voltage $V_{IN}$, on the other hand, toggles between a first and a second voltage level or state.

In the first state, the input voltage level is insufficient to turn N-channel FET MN 1 on. The first state occurs when the input voltage $V_{IN}$ is less than the threshold voltage $V_T$ of MN1. With the N-channel transistor MN1 turned off all of the current flows through the diode-connected transistor MN2. The output voltage VOUT is at a level high and has an amplitude described by the following equation:

$$VOUT = (2 \times I/[K \times W/L])0.5 + V_t$$

Where:
   I=current sourced through MN2;
   K=dielectric constant;
   W=gate width; and
   L=gate length.

In the second state, N-channel transistor MN1 is turned on and, thus, the output voltage $V_{OUT}$ is equal to the drain-to-source voltage of MN1. The drain to source voltage, however, is nearly zero depending on how far the input voltage is above the threshold voltage $V_T$. The drain-to-source voltage is insufficient to allow the diode-connected transistor MN2 to conduct current. As a result, all of the current is conducted through the N-channel transistor MN 1.

The constant current logic gate 30 is the logical equivalent of the inverter 10 of FIG. 1. Moreover, logic gate 30 provides lower electromagnetic emissions than its CMOS counterpart. However, unlike inverter 10, the constant current logic gate 30 has a DC current path regardless of the state of the input voltage $V_{IN}$. Therefore, static current testing of gate 30 cannot be performed.

As the input voltage signal transitions between either of the two states there is a slight perturbation in the current as it is diverted from one transistor to the other. The magnitude of the perturbation, however, is substantially less than the noise spike produced by the inverter of FIG. 1. Thus, the corresponding voltage drop produced by the inductive component of the supply conductor is reduced proportionately. The improved noise characteristics make constant current logic superior to typical CMOS in low noise applications. However, because of the constant bias current, static current testing cannot be performed on constant current logic without disabling the bias current.

A similar constant current logic gate can be constructed for a differential input signal, as shown in FIG. 4. The logic gate shown in FIG. 4 is commonly referred to as folded source coupled logic (FSCL). The FSCL gate 35 includes two constant current logic gates arranged in a symmetrical, differential configuration. The first half includes current source transistor MP2, input transistor MN3, and diode-connected transistor MN4. The second half consists of current source MP3, input transistor MN5, and diode-connected transistor MN6. Unlike the constant-current logic gate 30 the input transistors MN3 and MN5 of FSCL gate 35 are coupled to a second N-channel current source MN7. Current sources MP2 and MP3 are biased by a first bias voltage $V_{B1}$. The second current source MN7 is biased by a separate bias voltage $V_{B2}$.

Each half of FSCL gate 35 operates in substantially the same manner as constant current logic gate 30. Either the diode-connected transistor is conducting current or the corresponding input transistor is conducting current produced by the corresponding P-channel current source, i.e., MP2 or MP3. Unlike the single-ended, constant current logic gate 30, however, the gates of input transistors MN3 and MN5 are driven by opposite polarity signals IN and IN in a differential manner. Thus, as is apparent to one skilled in the art, either MN3 or MN5 are conducting, but not both. Therefore, differential output terminals 40 and 42 are at opposite polarites to each other to produce an inverted differential output OUT and/OUT.

The FSCL gate 35 also demonstrates the same low noise characteristics as does the constant current logic gate 30. It accomplishes this in the same manner as the constant current logic gate 30 by "steering" the current from one path to another without substantially changing the magnitude of the current. Like the constant current gate static current testing cannot be performed on FSCL gate 35 because of the DC path that exists in all input states. Accordingly, a need remains for static current testing of constant current logic families.

SUMMARY OF THE INVENTION

It is, therefore, an object of the invention to static current test CSL logic devices that consume a bias current during normal operating conditions.

Another object of the invention is to provide a circuit for accomplishing the static current test method on an integrated circuit.

The invention includes a plurality of constant current logic gates each having an input, an output, and a bias node, the inputs and outputs of the gates connected in a predetermined manner to accomplish a predetermined logic function. A bias switching means is used to switch the bias node of each gate between a source of bias voltage in a first normal operating mode and a source of shut-off voltage in a static current testing mode. In the preferred embodiment, the switching means includes a multiplexer.

In addition, where the logic gates include a diode-connected transistor coupled to the output, a cell switching means is interposed between the gate and drain of the diode-connected transistor for forcing the output to a logic low level and for isolating the diode-connected transistor from the output in the static current testing mode.

The invention also extends to differential static current logic gates such as folded source coupled logic gates. For differential logic gates, first and second bias switching means are included for switching their respective bias nodes. In addition, where the differential logic gates include a diode-connected transistor coupled to each differential output, a cell switching means is interposed between the gate and drain of each diode-connected transistor. The cell switching means forces the respective differential output to a logic low level and isolates the diode-connected transistor from the output in the static current testing mode.

An advantage of the invention is that it does not require significant additional silicon area to implement.

The foregoing and other objects, features and advantages of the invention will become more readily apparent from the following detailed description of a preferred embodiment of the invention which proceeds with reference to the accompanying drawings.

DETAILED DESCRIPTION

Figure 5:
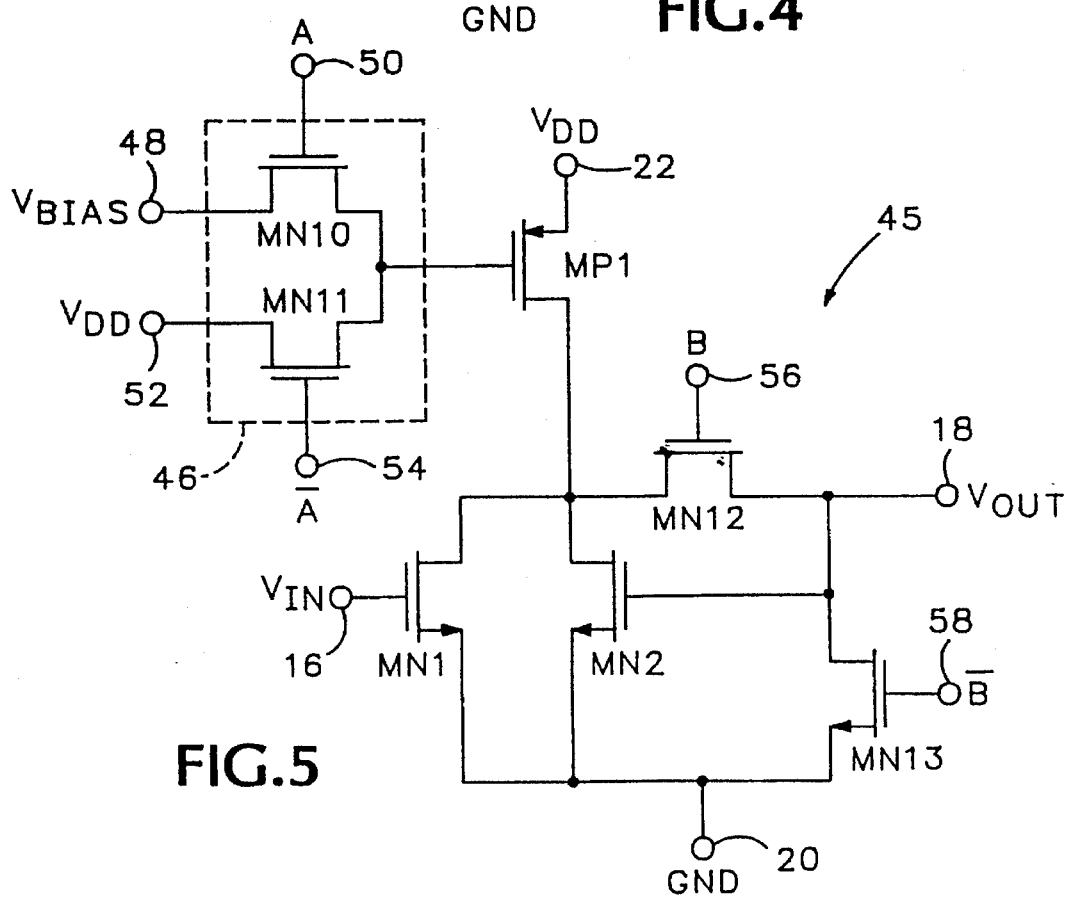
FIG. 5 is a schematic diagram of the constant current logic gate of FIG. 3 having static current testing capability.

A constant current logic gate 45 having static current test capability, according to the invention, is shown in FIG. 5. Only a single logic gate is shown in FIG. 5 for simplicity of illustration. The inventive principle can extend, however, to an entire integrated circuit having a multiplicity of such logic gates.

Figure 1:
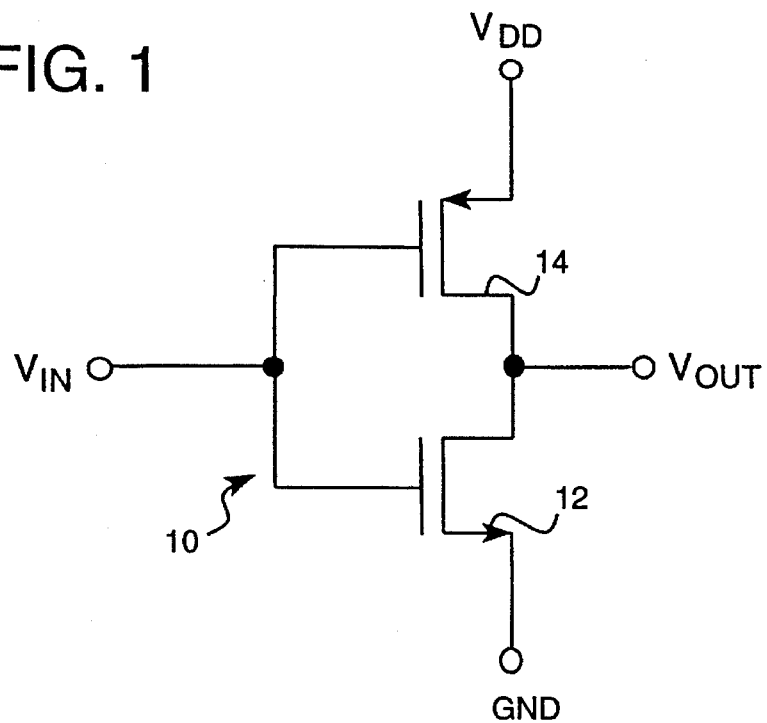
FIG. 1 is a schematic diagram of a CMOS inverter.
Figure 2A:
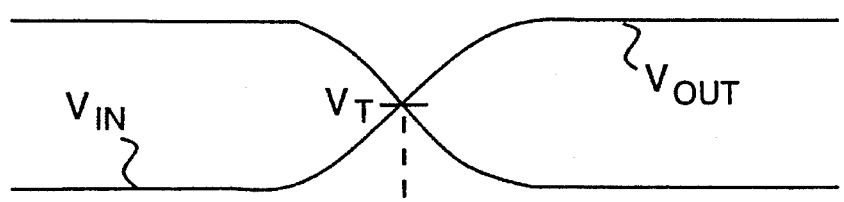
FIG. 2A are waveforms of the input and output voltage of the inverter of FIG. 1.
Figure 2B:
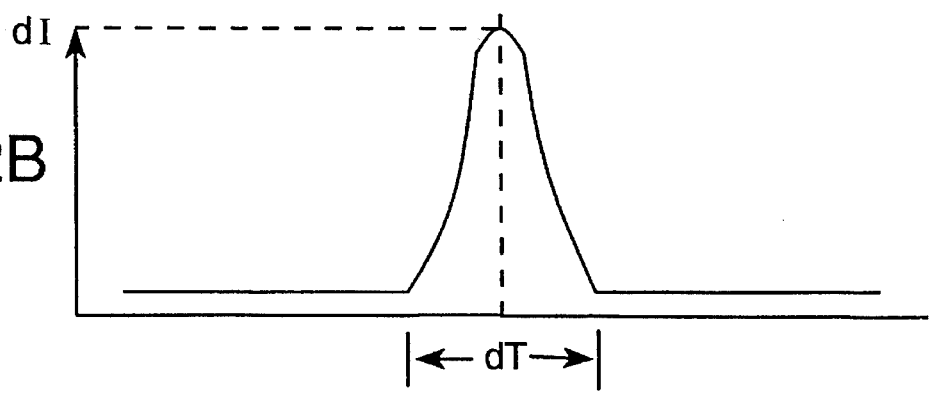
FIG. 2B is a waveform of the current through the inverter of FIG. 1 corresponding to the voltage waveforms of FIG. 2A.
Figure 3:
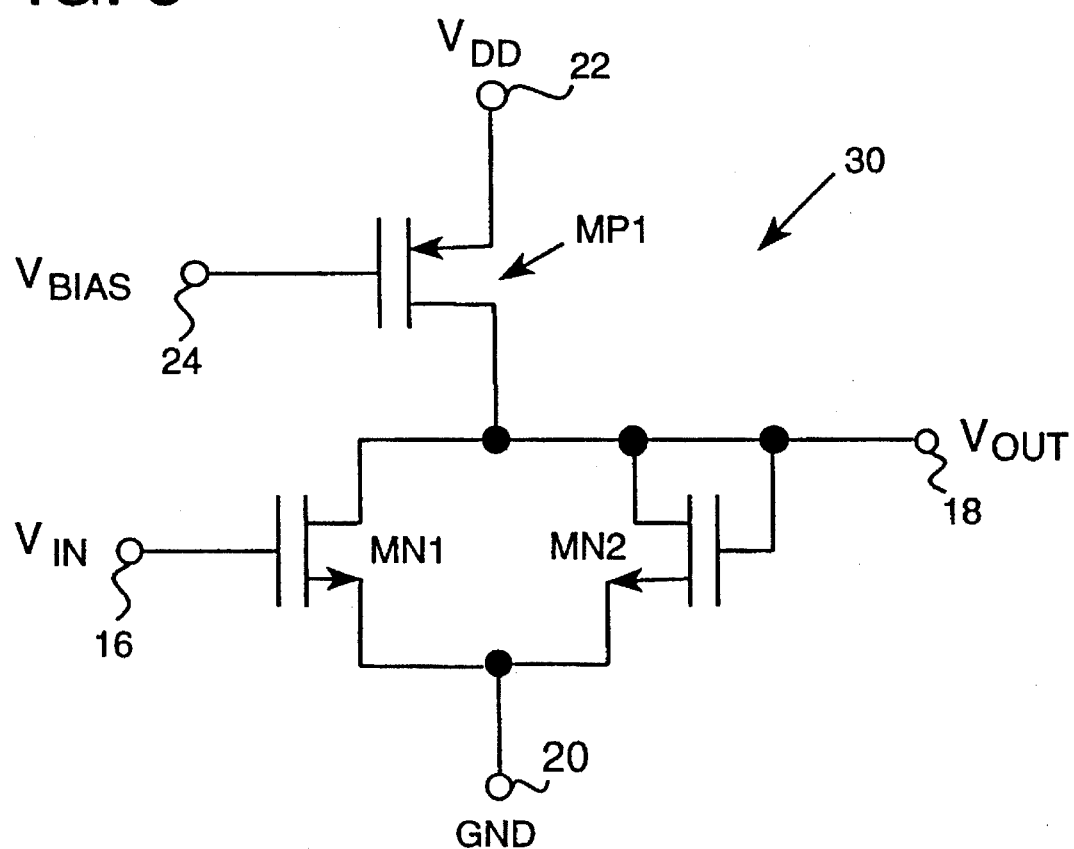
FIG. 3 is a schematic diagram of a constant current logic gate.

Logic gate 45 includes the constant current logic gate 30 of FIG. 2, including transistors MP1, MN1, and MN2, as well as multiplexer 46 and two additional N-channel transistors MN12 and MN13. Multiplexer 46 includes two N-channel transistors MN10 and MN11 connected in parallel. The drain of MN 10 is coupled to terminal 48 for receiving the bias voltage $V_{BIAS}$, the source is coupled to the gate of MP1, and the gate of MN10 is coupled to terminal 50 for receiving a first select signal A. The drain of the second transistor MN11 is coupled to terminal 52 for receiving a shut-off voltage, which in the preferred embodiment is $V_{DD}$. The source of MN11 is coupled to the source of MN10 to form the parallel connection. The gate of MN11 is coupled to terminal 54 for receiving a select signal /A, which is of opposite polarity to select signal A.

Multiplexer 46 switches the voltage at the gate of MP1 between the bias voltage $V_{BIAS}$, in a normal mode, and the shut-off voltage VDD, in a first, static testing mode. The select signal A and its complement /A enable either MN10 or MN11, but not both, to couple the voltage received at their drains to their respective sources. When the voltage at the gate of MP1 is equal to $V_{BIAS}$, i.e., A is enabled, MP1 operates normally acting as a current source. In contrast, when the voltage at the gate of MP1 is equal to $V_{DD}$, i.e., /A is enabled, the gate to source voltage is approximately zero and MP1 shuts off. Thus, the multiplexer 46 turns MP1 on or off, depending on the state of signals A and /A.

Other multiplexer organizations could accomplish this same function, as is apparent to those skilled in the art. For example, transistors MN10 and MN11 can be transmission gates rather than N-channel FETS as in the preferred embodiment. Moreover, the multiplexer can either be part of each individual gate, e.g., standard cell, as shown in FIG. 5, or the multiplexer can be included in the bias voltage generation circuitry (not shown). In the latter case, a single multiplexer can be coupled to some or all of the constant current logic gates, minimizing the additional silicon area consumed by the test circuitry.

Another change to the constant current logic gate 30 of FIG. 2 is the addition of N-channel transistor MN12 interposed between the drain and gate of diode-connected transistor MN2. The drain of MN12 is connected to the drain of MN2 and the source of MN 12 is connected to the gate of MN2 as well as output terminal 18. The gate of MN12 is coupled to terminal 56 for receiving a second select signal B. Also added to the constant current logic gate 30 is transistor MN13. The drain of transistor MN13 is coupled to the gate of MN2 and the source of MN 13 is coupled to GND terminal 20. The gate of MN 13 is coupled to terminal 58 for receiving a select signal /B, which is the complement of select signal B. Therefore, MN12 and MN 13 operate mutually exclusively dependent on the state of select signals B and /B.

In the normal mode, select signal B is enabled and MN 12 turns on. With MN 12 turned on, the drain and gate of MN2 are effectively coupled. In contrast, the complementary select signal /B is disabled and transistor MN 13 is turned off. Therefore, in normal mode, transistor MN2 effectively operates as a diode-connected transistor, as it did in FIG. 2.

In a second, static current testing mode, select signal B is disabled and signal /B is enabled. With signal B disabled, transistor MN12 is turned off, effectively isolating the drain of transistor of MN2 from the output terminal 18. Moreover, MN 13 forces the output signal $V_{OUT}$ to a logic low level. $V_{OUT}$ is required to be at a logic low level in order to avoid turning on a subsequent logic gate (not shown) in the second testing mode where the logic gates are in series, as further described below.

The second static current testing mode is performed in two phases. The first phase tests for any static current due to MP1, and the second phase tests for any static current due to MN 1 or MN2. In the first phase the voltage supplied to the gate of MP1 is switched from the bias voltage $V_{BIAS}$ to the shut-off voltage $V_{DD}$. This is accomplished by disabling select signal A and enabling the complementary signal /A, and enabling select signal B and disabling the complementary signal /B. Next, the static current supplied to the logic circuit is measured. If the static current exceeds a predetermined limit, the device is sorted as a potential reliability problem.

The testing phase isolates transistor MP1 by attempting to turn it off. If MP1 does not draw any static current, even with MN1 and MN2 enabled, no static current should be detected. Where, however, MP1 does draw a static current, e.g., due to a short between the source and drain of MP1, either MN1 or MN2 will source this current depending upon the state of $V_{In}$. Thus, the first testing mode isolates any static current problems due to MP1.

In the second phase MP1 is turned on by enabling signal A and disabling signal /A, and transistors MN1 and MN2 are turned off. Transistors MN1 and MN2 are turned off by disabling the input voltage $V_{IN}$, disabling select signal B, and enabling select signal /B. Disabling input voltage $V_{IN}$ turns MN1 off. Disabling signal B isolates transistor MN2 from the output terminal 18. Enabling signal /B has the dual effect of turning MN2 off and turning off any input transistors connected to the output terminal 18 by pulling output voltage $V_{OUT}$ to a logic low level. With both MN1 and MN2 turned off, the current that could be sourced by MP1 cannot flow through these transistors to ground. Thus, there should be no static current measured. If, however, a static current is measured, it implies that either MN1 or MN2 has a defect that causes static current to flow, e.g. drain-to-source short or low impedance. Therefore, if the measured static current exceeds the predetermined level, the device is rejected as a potential reliability problem due to either MN 1 or MN2. A table showing the states of select signal A, /A, B, and /B are shown below in Table 1 along with the corresponding mode.

TABLE 1

| Vin | A | /A | B | /B | Mode |
|---|---|---|---|---|---|
| * | 0 | 1 | 1 | 0 | Static Current Testing Mode (First Phase) |
| 0 | 1 | 0 | 0 | 1 | Static Current Testing Mode (Second Phase) |
| * | 1 | 0 | 1 | 0 | Normal Mode |

* = don't care

Figure 4:
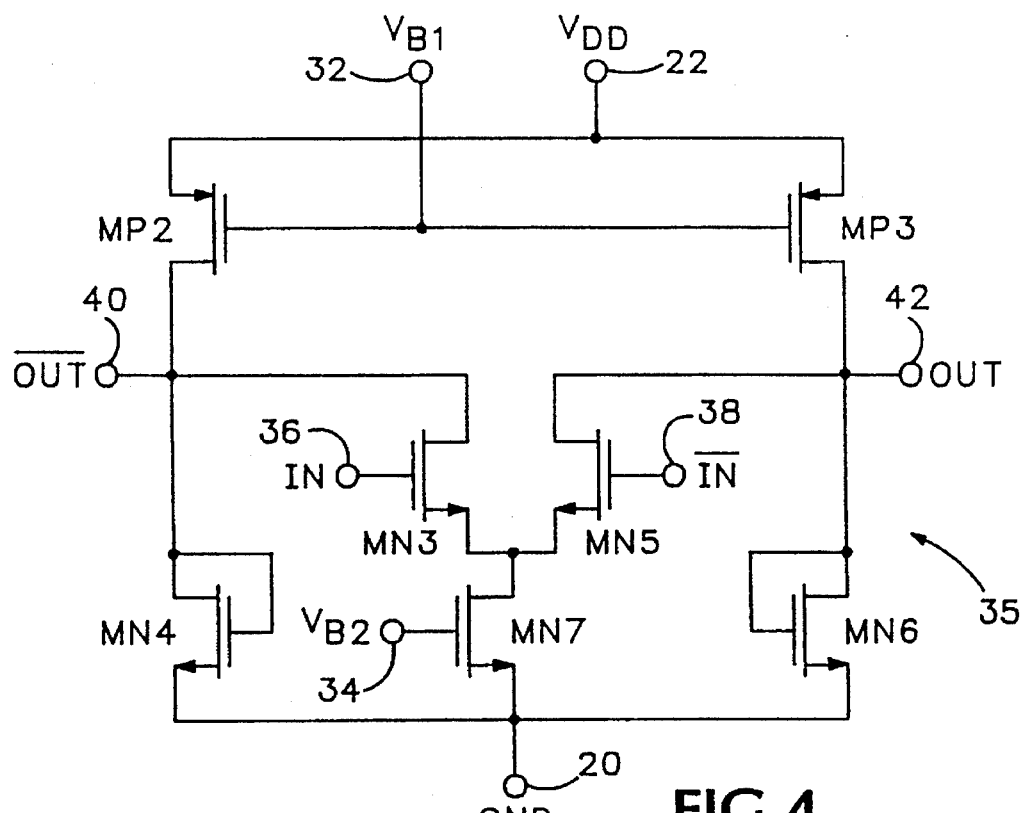
FIG. 4 is a schematic diagram of a folded source coupled logic gate.
Figure 6:
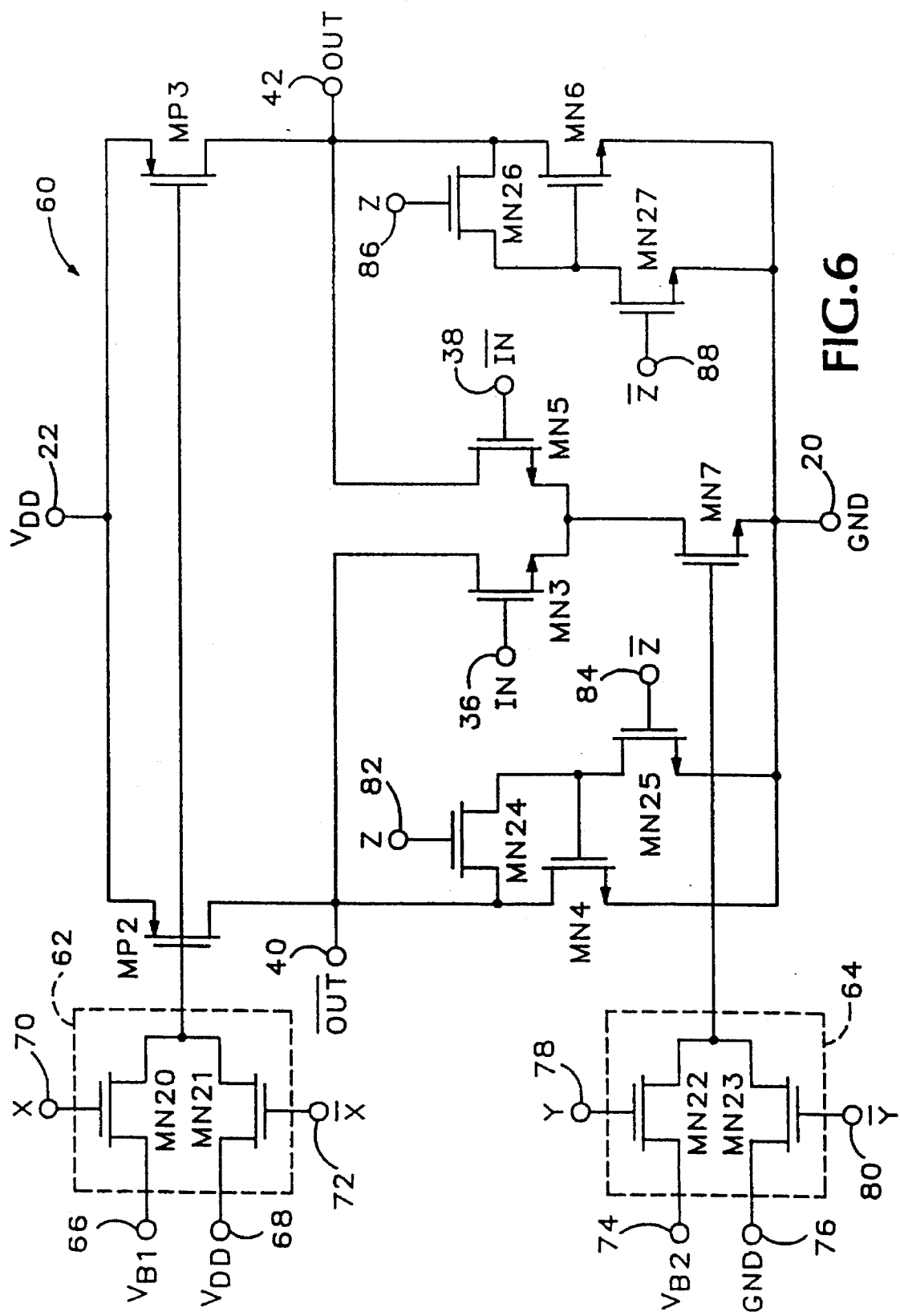
FIG. 6 is a schematic diagram of the folded source coupled logic gate of FIG. 4 having static current testing capability.

A differential constant current logic gate 60 having static current test capability is shown in FIG. 6. The logic gate 60 corresponds to the FSCL gate 35 of FIG. 4 with additional circuitry to allow static current testing of the gate. The reference numerals of common parts are the same between the FIG. 4 and FIG. 6 to facilitate the description. The logic gate 60, in addition to an FSCL gate, includes a first multiplexer 62 and a second multiplexer 64, and FETS MN24-MN27 connected to the two diode-connected transistors MN4 and MN6.

The first multiplexer 62 consists of FETS MN20 and MN21 coupled to the gates of transistors MP2 and MP3. The drain of MN20 is coupled to terminal 66 for receiving a first bias voltage $V_{B1}$, which is approximately the same bias voltage required in FIG. 4. The drain of MN21, however, is coupled to terminal 68 for receiving a first shut-off voltage, which, in this case, corresponds to the supply voltage $V_{DD}$. The sources of MN20 and MN21 are coupled together in a parallel connection. The sources are further coupled to the gates of transistors MP2 and MP3. The gate of MN20 is coupled to a terminal 70 for receiving a select signal X. The gate of MN21 is coupled to terminal 72 for receiving a select signal /X of opposite polarity to signal X.

The multiplexer 62 switches the voltage at the gates of transistors MP2 and MP3 between the bias voltage $V_{B1}$ and the shut-off voltage $V_{DD}$. The voltage at the gates of MP2 and MP3 is determined by the state of signals X and /X. If X is at a logic high and, therefore /X is at a logic low, transistor MN20 is turned on and MN21 is turned off. Thus, the voltage at the gates of MP2 and MP3 is approximately equal to $V_{B1}$. This state corresponds to a normal mode of operation since transistors MP2 and MP3 are biased to their normal operating point and supplying current to their respective legs of the logic gate. If, however, signal X is at a logic low, and therefore/X is at a logic high, transistor MN20 is turned off and MN21 is turned on. Thus, the voltage at the gates of MP2 and MP3 is approximately equal to $V_{DD}$. This state corresponds to a static current test mode for testing transistors MP2 and MP3, as described further below, since transistors MP2 and MP3 are turned off and are not conducting any current, absent a defect.

Similarly, the second multiplexer 64 consists of FETS MN22 and MN23 coupled to the gate of transistor MN7. The drain of MN22 is coupled to terminal 74 for receiving a second bias voltage $V_{B2}$. The drain of MN23, however, is coupled to terminal 76 for receiving a second shut-off voltage, which, in this case, corresponds to the common voltage GND. As in multiplexer 62, the sources of MN22 and MN23 are coupled together in a parallel connection. The sources are further coupled to the gate of transistor MN7. The gate of MN22 is coupled to a terminal 78 for receiving a select signal Y. The gate of MN23, however, is coupled to terminal 80 for receiving a select signal/Y of opposite polarity to signal Y.

The multiplexer 64 switches the voltage at the gate of transistor MN7 between the bias voltage V.B2 and the shut-off voltage GND. The voltage at the gate MN7 is determined by the state of signals Y and/Y. If Y is at a logic high and, therefore/Y is at a logic low, transistor MN22 is turned on and MN23 is turned off. Thus, the voltage at the gate MN7 is approximately equal to $V_{B2}$. This state corresponds to the normal mode of operation since transistor MN7 is biased to a normal operating point and sinking current from either transistor MN3 or MN5, depending on the state of the input voltage $V_{IN}$.

If, however, signal Y is at a logic low, and therefore/Y is at a logic high, transistor MN22 is turned off and MN23 is turned on. Thus, the voltage at the gate of MN7 is approximately equal to GND. This state corresponds to static current test mode for testing MN7 since transistor MN7 is turned off and not conducting any current, absent a defect. In the preferred embodiment, the multiplexers 62 and 64 are separated from the logic gate, located instead at the bias voltage generation source for connection to multiple logic gate (not shown in FIG.6). The multiplexers can also be incorporated directly into a standard cell for each gate, although this requires additional silicon area.

As with the constant current logic gate 45, the normally diode-connected transistors MN4 and MN6 of logic gate 60 have additional transistors coupled thereto for forcing the output of the diode-connected transistors to a logic low level and for isolating the transistor from the logic gate output in static current testing mode. Transistor MN24 is interposed between the source and gate of diode-connected transistor MN4. The source of MN24 coupled to the source of MN4 and the drain of MN24 coupled to the gate of MN4. The gate of MN24 is coupled to terminal 82 for receiving a select signal Z.

A transistor MN25 is coupled to the gate of MN4 for forcing the output voltage/OUT at terminal 40 low by turning transistor MN4 off. The drain of MN25 is coupled to the gate of MN4 and the source of MN25 is coupled to terminal 24. The gate of MN25 is coupled to terminal 84 for receiving select signal/Z, which is the complement of select signal Z. Transistors MN24 and MN25 operate in precisely the same manner with respect to diode-connected transistor MN4 as transistors MN 12 and MN 13 operated with respect to diode-connected transistor MN2 described above.

The diode-connected transistor MN6 has an identical arrangement as MN4. Transistor MN26 is interposed between the source and gate of diode-connected transistor MN6. The source of MN26 coupled to the source of MN6 and the drain of MN26 coupled to the gate of MN6. The gate of MN26 is coupled to terminal 86 for receiving a select signal Z.

A transistor MN27 is coupled to the gate of MN6 for forcing the output voltage OUT at terminal 42 low by turning transistor MN6 off. The drain of MN27 is coupled to the gate of MN6 and the source of MN27 is coupled to terminal 20. The gate of MN27 is coupled to terminal 88 for receiving select signal/Z.

In a normal operational mode, select signals X, Y, and Z all enabled, and, therefore,/X,/Y, and/Z are disabled. With X enabled multiplexer 62 imposes bias voltage $V_{B1}$ on the gates of transistors MP2 and MP3. The bias voltage $V_{B1}$ biases transistors MP2 and MP3 into their conduction regions to provide current to their respective legs of the gate 60. With Y enabled, multiplexer 64 imposes bias voltage $V_{B2}$ on the gate of transistor MN7. The bias voltage $V_{B2}$ biases MN7 into its conduction region allowing MN7 to source any current from either MN3 or MN5. With Z enabled, transistors MN24 and MN26 are turned on and MN25 and MN27 are turned off. Thus, both diode-connected transistors MN4 and MN6 operate as diodes. Therefore, logic gate 60 operates as the equivalent of logic gate 35 of FIG. 4, with the current produced by MP2 and MP3 flowing through either the corresponding input transistor or diode-connected transistor.

In a first phase of the static current testing mode, select signal X is disabled, and therefore/X is enabled, while select signals Y and Z remain enabled. Disabling select signal X causes multiplexer 62 to switch the voltage as seen at the gates of MP2 and MP3 from the bias voltage $V_{B1}$ to the shut-off voltage $V_{DD}$. This causes both MP2 and MP3 to shut-off and inhibits any current from being produced by either MP2 or MP3. With MP2 and MP3 shut off, there should be no current flowing from terminal 22 or, considered another way, flowing into terminal 20. If any current is detected at either modes 20 or 22 there must be a defect in either MP2 or MP3. Thus, the first static current mode detects any defects in transistors MP2 or MP3.

In a second phase of the static current test mode, select signals Y and Z, as well as inputs IN and/IN are enabled while select signal X is enabled. Enabling signal X imposes the bias voltage $V_{B1}$ on the gate of transistors MP2 and MP3. Thus, these transistors are able to supply current in the event there is a DC path for the current to flow. With Y and Z disabled, however, and where there are no defects in the circuit, there should be no DC path in the circuit, therefore, if a static current is detected, then there exists a defect in the remaining circuitry. Thus, the entire circuit can be static current tested. A summary of the available test modes for the logic gate 60 is shown in Table 2 below.

TABLE 2

| In | /In | X | /X | Y | /Y | X | /Z | Mode |
|---|---|---|---|---|---|---|---|---|
| * | * | 0 | 1 | 1 | 0 | 1 | 0 | Static Current Testing Mode (First Phase) |
| 1 | 1 | 1 | 0 | 0 | 1 | 0 | 1 | Static Current Testing Mode (Second Phase) |
| * | * | 1 | 0 | 1 | 0 | 1 | 0 | Normal Mode |

* = don't care

Having illustrated and described the principles of our invention in a preferred embodiment thereof, it should be readily apparent to those skilled in the art that the invention can be modified in arrangement and detail without departing from such principles. For example, the constant current logic gates shown are all inverters, however, static current capability can be added to any constant current logic gate, e.g., OR gate, AND gate, NOR gate, etc., using the same inventive technique. Also, the exact correspondence between the number of muxes and gates can be modified according to design constraints. We claim all modifications coming within the spirit and scope of the accompanying claims.

We claim:

1. A logic circuit comprising:
   a folded source coupled logic gate having an input, an output, and a bias node, the logic gate consuming a substantially constant current during a normal operating mode; and
   bias switching means for switching the bias node between a source of bias voltage in the normal operating mode and a source of shut-off voltage in a static current testing mode.

2. A logic circuit according to claim 1 in which the bias switching means comprises a multiplexer having a first input for receiving the bias voltage, a second input for receiving the shut-off voltage, an output coupled to the bias node, and a control input for receiving a select signal for selecting between the bias voltage and the shut-off voltage.

3. A logic circuit comprising:
   a static current logic gate having an input, an output, and a bias node, the static current logic gate including a diode-connected transistor having a gate and a drain forming an anode coupled to the output; and
   bias switching means for switching the bias node between a source of bias voltage in a normal operating mode and a source of shut-off voltage in a static current testing mode.

4. A logic circuit according to claim 3 in which the static current logic gate further comprises means for isolating the diode-connected transistor from the output in the static current testing mode.

5. A logic circuit according to claim 4 in which the isolating means includes
   a first transistor interposed between the drain and the gate of the diode-connected transistor and having a gate for receiving a first select signal.

6. A differential logic circuit comprising:
   a static current logic gate having first and second differential inputs, first and second differential outputs, and first and second bias nodes;
   first bias switching means for switching the first bias node between a first source of bias voltage in a normal operating mode and a first source of shut-off voltage in a first static current testing phase; and
   second bias switching means for switching the second bias node between a second source of bias voltage in the normal operating mode and a second source of shut-off voltage in a second static current testing phase.

7. A logic circuit according to claim 6 in which the first bias switching means comprises a first multiplexer having a first input for receiving the first bias voltage, a second input for receiving the first shut-off voltage, an output coupled to the first bias node, and a first control input for receiving a first select signal for selecting between the first bias voltage and the first shut-off voltage.

8. A logic circuit according to claim 6 in which the second bias switching means comprises a second multiplexer having a first input for receiving the second bias voltage, a second input for receiving the second shut-off voltage, an output coupled to the second bias node, and a second control input for receiving a second select signal for selecting between the second bias voltage and the second shut-off voltage.

9. A logic circuit according to claim 6 in which the static current logic gate includes:
   a first diode-connected transistor having a gate and a drain forming an anode coupled to the first differential output; and
   a second diode-connected transistor having a gate and a drain forming an anode coupled to the second differential output.

10. A logic circuit according to claim 9 in which the static current logic gate further comprises:
    first means for forcing the first differential output to a predetermined logic level in the second static current testing phase;
    first means for isolating the first diode-connected transistor from the first differential output in the second static current testing phase;
    second means for forcing the second differential output to the predetermined logic level in the second static current testing phase; and
    second means for isolating the diode-connected transistor from the output in the second static current testing phase.

11. A logic circuit according to claim 10 in which the first forcing means includes
    a first transistor interposed between the drain and the gate of the first diode-connected transistor and having a gate for receiving a first select signal; and in which the first isolating means includes
    a second transistor having a first node coupled to the output, a second node coupled to ground, and a gate for receiving a second select signal.

12. A logic circuit according to claim 10 in which the second forcing means includes
    a first transistor interposed between the drain and the gate of the second diode-connected transistor and having a gate for receiving a first select signal; and in which the second isolating means includes
    a second transistor having a first current node coupled to the output, a second current node coupled to ground, and a gate for receiving a second select signal.

13. A static current testing method for logic circuits comprising:
    providing a logic circuit including a static current logic gate having an input, a bias node for receiving a bias voltage, and an output;
    switching the bias node between a source of bias voltage in a normal operational mode and a source of shut-off voltage in a static current testing mode; and
    measuring a static current consumed by the logic gate 14. A static current testing method according to claim 13 further comprising the step of comparing the measured static current to a predetermined failure limit.

15. A static current testing method according to claim 13 further comprising the step of detecting when the measured current is greater than a predetermined failure limit.

16. A static current testing method according to claim 13 further comprising:
    switching the bias node from the source of shut-off voltage to the source of bias voltage;
    forcing the inputs and outputs of the logic gate to a logic low level during a second phase of the static current testing mode;

measuring a static current consumed by the logic gate during the second phase of the static current testing mode.

17. A static current testing method according to claim 16 further comprising the step of comparing the measured static current to a predetermined failure limit.

18. A static current testing method for logic circuits comprising:

providing a logic circuit including a static current logic gate having a pair of differential inputs, a first bias node for receiving a first bias voltage, a second bias node for receiving a second bias voltage, and a pair of differential outputs;

applying the first bias voltage to the first bias node during a normal mode;

applying the second bias voltage to the second bias node during the normal mode;

switching the first bias node between the first bias voltage and a first shut-off voltage in a first static current testing phase; and measuring a static current consumed by the logic gate in the first testing phase.

19. A static current testing method according to claim 18 further comprising the step of switching the second bias node between the second bias voltage in the normal mode and a second shut-off voltage in a second static current testing phase.

20. A static current testing method according to claim 19 further comprising the step of detecting when the measured current is greater than a predetermined failure limit.

21. A logic circuit according to claim 4 in which the static current logic gate further comprises means for forcing the output to a logic low level in the static current testing mode.

22. A logic circuit according to claim 21 in which the forcing means includes a second transistor having a first node coupled to the output, a second node coupled to ground, and a gate for receiving a second select signal.

23. A static current testing method according to claim 18 further comprising the step of forcing the differential inputs and the differential outputs of the logic gate to a logic low level during the second static current testing phase.

\* \* \* \* \*